（12） United States Patent
Dwilinski et al.

(10) Patent No.: US 8,398,767 B2
(45) Date of Patent: Mar. 19, 2013

(54) BULK MONO-CRYSTALLINE GALLIUM-CONTAINING NITRIDE AND ITS APPLICATION

(75) Inventors: Robert Dwilinski, Warsaw (PL); Roman Doradzinski, Warsaw (PL); Jerzy Garczynski, Lomianki (PL); Leszek Sierzputowski, Union, NJ (US); Yasuo Kanbara, Anan (JP); Robert Kucharski, Warsaw (PL)

(73) Assignees: Ammono S.A., Warsaw (PL); Nichia Corporation, Anan-shi (JP)

( * ) Notice: Subject to any disclaimer, the term of this patent is extended or adjusted under 35 U.S.C. 154(b) by 1451 days.

(21) Appl. No.: 11/629,109

(22) PCT Filed: Jun. 10, 2005

(86) PCT No.: PCT/JP2005/011093
§ 371 (c)(1),
(2), (4) Date: Dec. 11, 2006

(87) PCT Pub. No.: WO2005/121415
PCT Pub. Date: Dec. 22, 2005

(65) Prior Publication Data
US 2008/0303032 A1 Dec. 11, 2008

(30) Foreign Application Priority Data

Jun. 11, 2004 (PL) .......................................... 368483
Jun. 25, 2004 (PL) .......................................... 368781

(51) Int. Cl.
*C30B 9/00* (2006.01)

(52) U.S. Cl. ................. 117/73; 117/68; 117/74; 117/75; 117/77; 117/78; 117/952; 257/615
(58) Field of Classification Search .................. 257/615; 117/68, 73, 74, 75, 77, 78, 952
See application file for complete search history.

(56) References Cited

U.S. PATENT DOCUMENTS

| 5,096,860 | A | 3/1992 | Nadkarni |
| 5,147,623 | A | 9/1992 | Eun et al. |

(Continued)

FOREIGN PATENT DOCUMENTS

| CN | 1036414 A | 10/1989 |
| CN | 1289867 A | 4/2001 |

(Continued)

OTHER PUBLICATIONS

Communication pursuant to Article 94(3) EPC directed to European Patent Application No. 02 762 734.8, dated Oct. 21, 2009; 4 pages.

(Continued)

*Primary Examiner* — Matthew Song
(74) *Attorney, Agent, or Firm* — Smith Patent Office

(57) ABSTRACT

Bulk mono-crystalline gallium-containing nitride, grown on the seed at least in the direction essentially perpendicular to the direction of the seed growth, essentially without propagation of crystalline defects as present in the seed, having the dislocation density not exceeding $10^4/cm^2$ and considerably lower compared to the dislocation density of the seed, and having a large curvature radius of the crystalline lattice, preferably longer than 15 m, more preferably longer than 30 m, and most preferably of about 70 m, considerably longer than the curvature radius of the crystalline lattice of the seed.

18 Claims, 4 Drawing Sheets

U.S. PATENT DOCUMENTS

Figure 1:
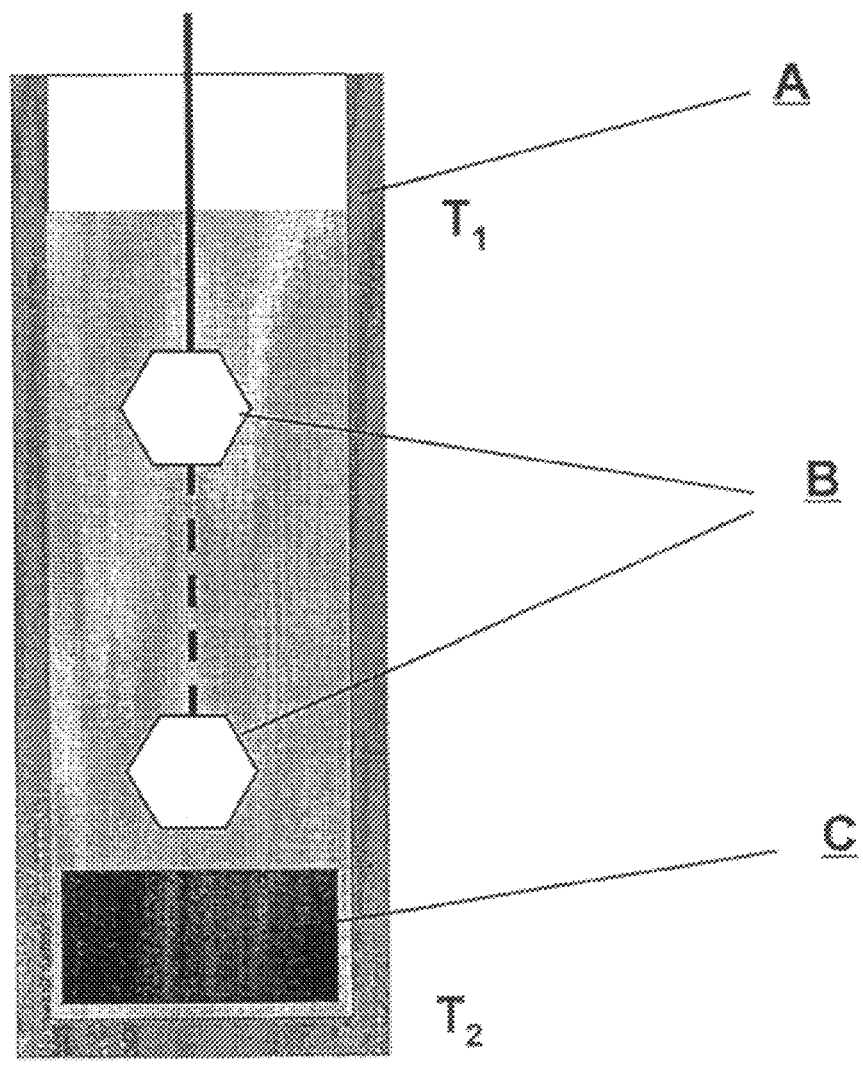

| | | |
|---|---|---|
| 5,190,738 A | 3/1993 | Parent |
| 5,306,662 A | 4/1994 | Nakamura et al. |
| 5,456,204 A | 10/1995 | Dimitrov et al. |
| 5,589,153 A | 12/1996 | Garces et al. |
| 5,637,531 A | 6/1997 | Porowski et al. |
| 5,679,965 A | 10/1997 | Schetzina |
| 5,780,876 A | 7/1998 | Hata |
| 5,868,837 A | 2/1999 | DiSalvo et al. |
| 5,868,873 A | 2/1999 | Brown et al. |
| 5,928,421 A | 7/1999 | Yuri et al. |
| 6,031,858 A | 2/2000 | Hatakoshi et al. |
| 6,046,464 A | 4/2000 | Schetzina |
| 6,051,145 A | 4/2000 | Griffth et al. |
| 6,067,310 A | 5/2000 | Hashimoto et al. |
| 6,139,628 A | 10/2000 | Yuri et al. |
| 6,150,674 A | 11/2000 | Yuri et al. |
| 6,153,010 A | 11/2000 | Kiyoku et al. |
| 6,156,581 A | 12/2000 | Vaudo et al. |
| 6,172,382 B1 | 1/2001 | Nagahama et al. |
| 6,177,057 B1 | 1/2001 | Purdy |
| 6,177,292 B1 | 1/2001 | Hong et al. |
| 6,248,607 B1 | 6/2001 | Tsutsui |
| 6,249,534 B1 | 6/2001 | Itoh et al. |
| 6,252,261 B1 | 6/2001 | Usui et al. |
| 6,258,617 B1 | 7/2001 | Nitta et al. |
| 6,265,322 B1 | 7/2001 | Anselm et al. |
| 6,270,569 B1 | 8/2001 | Shibata et al. |
| 6,303,403 B1 | 10/2001 | Sato et al. |
| 6,316,785 B1 | 11/2001 | Nunoue et al. |
| 6,329,215 B1 | 12/2001 | Porowski et al. |
| 6,335,546 B1 | 1/2002 | Tsuda et al. |
| 6,355,497 B1 | 3/2002 | Romano et al. |
| 6,372,041 B1 | 4/2002 | Cho et al. |
| 6,380,051 B1 | 4/2002 | Yuasa et al. |
| 6,398,867 B1 | 6/2002 | D'Evelyn et al. |
| 6,399,500 B1 | 6/2002 | Porowski et al. |
| 6,399,966 B1 | 6/2002 | Tsuda et al. |
| 6,407,409 B2 | 6/2002 | Cho et al. |
| 6,423,984 B1 | 7/2002 | Kato et al. |
| 6,447,604 B1 | 9/2002 | Flynn et al. |
| 6,459,712 B2 | 10/2002 | Tanaka et al. |
| 6,468,882 B2 | 10/2002 | Motoki et al. |
| 6,475,277 B1 | 11/2002 | Hirota et al. |
| 6,509,651 B1 | 1/2003 | Matsubara et al. |
| 6,531,072 B1 | 3/2003 | Suda et al. |
| 6,534,795 B2 | 3/2003 | Hori et al. |
| 6,562,466 B2 | 5/2003 | Jiang et al. |
| 6,586,762 B2 | 7/2003 | Kozaki |
| 6,592,663 B1 | 7/2003 | Sarayama et al. |
| 6,593,589 B1 | 7/2003 | Osinski et al. |
| 6,596,079 B1 | 7/2003 | Vaudo et al. |
| 6,614,824 B2 | 9/2003 | Tsuda et al. |
| 6,627,552 B1 | 9/2003 | Nishio et al. |
| 6,639,925 B2 | 10/2003 | Niwa et al. |
| 6,653,663 B2 | 11/2003 | Ishida |
| 6,656,615 B2 | 12/2003 | Dwilinski et al. |
| 6,657,232 B2 | 12/2003 | Morkoc |
| 6,677,619 B1 | 1/2004 | Nagahama et al. |
| 6,686,608 B1 | 2/2004 | Takahira |
| 6,693,935 B2 | 2/2004 | Tojo et al. |
| 6,711,191 B1 | 3/2004 | Kozaki et al. |
| 6,720,586 B1 | 4/2004 | Kidoguchi et al. |
| 6,749,819 B2 | 6/2004 | Otsuka et al. |
| 6,858,882 B2 | 2/2005 | Tsuda et al. |
| 6,924,512 B2 | 8/2005 | Tsuda et al. |
| 6,951,695 B2 | 10/2005 | Xu et al. |
| 7,053,413 B2 | 5/2006 | D'Evelyn et al. |
| 7,057,211 B2 | 6/2006 | Dwilinski et al. |
| 7,081,162 B2 | 7/2006 | Dwilinski et al. |
| 7,097,707 B2 | 8/2006 | Xu |
| 7,099,073 B2 | 8/2006 | Chowdhury et al. |
| 7,132,730 B2 * | 11/2006 | Dwili ski et al. ............. 257/615 |
| 7,160,388 B2 | 1/2007 | Dwilinski et al. |
| 7,252,712 B2 | 8/2007 | Dwilinski et al. |
| 7,291,544 B2 | 11/2007 | D'Evelyn et al. |
| 7,314,517 B2 | 1/2008 | Dwilinski et al. |
| 7,315,599 B1 | 1/2008 | Morriss |
| 7,335,262 B2 | 2/2008 | Dwilinski et al. |
| 7,364,619 B2 | 4/2008 | Dwilinski et al. |
| 7,374,615 B2 | 5/2008 | Dwilinski et al. |
| 7,387,677 B2 | 6/2008 | Dwilinski et al. |
| 7,410,539 B2 | 8/2008 | Dwilinski et al. |
| 7,420,261 B2 | 9/2008 | Dwili ski et al. |
| 7,422,633 B2 | 9/2008 | Dwilinski et al. |
| 2001/0008656 A1 | 7/2001 | Tischler et al. |
| 2001/0015437 A1 | 8/2001 | Ishii et al. |
| 2001/0022154 A1 | 9/2001 | Cho et al. |
| 2001/0030328 A1 | 10/2001 | Ishida |
| 2002/0011599 A1 | 1/2002 | Motoki et al. |
| 2002/0014631 A1 | 2/2002 | Iwata et al. |
| 2002/0028564 A1 | 3/2002 | Motoki et al. |
| 2002/0031153 A1 | 3/2002 | Niwa et al. |
| 2002/0047113 A1 | 4/2002 | Ohno et al. |
| 2002/0063258 A1 | 5/2002 | Motoki |
| 2002/0078881 A1 | 6/2002 | Cuomo et al. |
| 2002/0096674 A1 | 7/2002 | Cho et al. |
| 2002/0189531 A1 | 12/2002 | Dwilinski et al. |
| 2002/0192507 A1 * | 12/2002 | Dwilinski et al. ............. 428/698 |
| 2003/0001238 A1 | 1/2003 | Ban |
| 2003/0003770 A1 | 1/2003 | Morita et al. |
| 2003/0022028 A1 | 1/2003 | Koike et al. |
| 2003/0119239 A1 * | 6/2003 | Koike et al. .................. 438/200 |
| 2003/0143771 A1 | 7/2003 | Kidoguchi et al. |
| 2003/0164138 A1 * | 9/2003 | Sarayama et al. ............... 117/84 |
| 2003/0209191 A1 | 11/2003 | Purdy |
| 2004/0003495 A1 | 1/2004 | Xu |
| 2004/0031978 A1 | 2/2004 | D'Evelyn et al. |
| 2004/0089221 A1 | 5/2004 | Dwilinski et al. |
| 2004/0139912 A1 | 7/2004 | Dwilinski et al. |
| 2004/0238810 A1 | 12/2004 | Dwilinski et al. |
| 2004/0244680 A1 | 12/2004 | Dwilinski et al. |
| 2004/0251471 A1 | 12/2004 | Dwilinski et al. |
| 2004/0255840 A1 | 12/2004 | Dwilinski et al. |
| 2004/0261692 A1 | 12/2004 | Dwilinski et al. |
| 2005/0087124 A1 | 4/2005 | Dwilinski et al. |
| 2005/0249255 A1 | 11/2005 | Dwilinski et al. |
| 2006/0032428 A1 | 2/2006 | Dwilinski et al. |
| 2006/0037530 A1 | 2/2006 | Dwilinski et al. |
| 2006/0054075 A1 | 3/2006 | Dwilinski et al. |
| 2006/0054076 A1 | 3/2006 | Dwilinski et al. |
| 2006/0057749 A1 | 3/2006 | Dwilinski et al. |
| 2006/0120931 A1 | 6/2006 | Dwilinski et al. |
| 2006/0124051 A1 | 6/2006 | Yoshioka et al. |
| 2006/0138431 A1 | 6/2006 | Dwilinski et al. |
| 2006/0177362 A1 | 8/2006 | D'Evelyn et al. |
| 2006/0191472 A1 | 8/2006 | Dwilinski et al. |
| 2007/0234946 A1 | 10/2007 | Hashimoto et al. |
| 2008/0050855 A1 | 2/2008 | Dwilinski et al. |
| 2008/0067523 A1 | 3/2008 | Dwilinski et al. |
| 2008/0102016 A1 | 5/2008 | Hashimoto |
| 2008/0108162 A1 | 5/2008 | Dwilinski et al. |
| 2008/0156254 A1 | 7/2008 | Dwilinski et al. |
| 2008/0303032 A1 | 12/2008 | Dwilinski et al. |
| 2009/0072352 A1 | 3/2009 | Hashimoto et al. |

FOREIGN PATENT DOCUMENTS

| | | |
|---|---|---|
| CN | 1065289 C | 5/2001 |
| CN | 1260409 C | 6/2006 |
| EP | 0716457 A | 6/1996 |
| EP | 0716457 A2 | 6/1996 |
| EP | 0711853 B | 9/1999 |
| EP | 0949731 A | 10/1999 |
| EP | 0973207 A | 1/2000 |
| EP | 1088914 A | 4/2001 |
| EP | 1164210 A | 12/2001 |
| EP | 1405936 A | 7/2004 |
| EP | 1514958 A1 | 3/2005 |
| EP | 1616981 A | 1/2006 |
| EP | 1770189 A2 | 4/2007 |
| FR | 2796657 A | 1/2001 |
| GB | 2326160 A | 12/1998 |
| GB | 2333521 A | 7/1999 |
| JP | 51-41686 A | 4/1976 |
| JP | 60065798 A | 4/1985 |
| JP | 2-137287 A | 5/1990 |
| JP | 5-183189 A | 7/1993 |
| JP | 7-22692 B | 3/1995 |

| | | |
|---|---|---|
| JP | 7-165498 A | 6/1995 |
| JP | 7-249830 A | 9/1995 |
| JP | 8-250802 A | 9/1996 |
| JP | 9-134878 A | 5/1997 |
| JP | 9-508093 A | 8/1997 |
| JP | 9-293897 A | 11/1997 |
| JP | 9-512385 A | 12/1997 |
| JP | 10-7496 A | 1/1998 |
| JP | 10-70079 A | 3/1998 |
| JP | 10-70338 A | 3/1998 |
| JP | 11-54847 A | 2/1999 |
| JP | 11-189498 A | 7/1999 |
| JP | 11-224856 A | 8/1999 |
| JP | 11-307813 A | 11/1999 |
| JP | 11-340573 A | 12/1999 |
| JP | 2000-44400 A | 2/2000 |
| JP | 2000-82863 A | 3/2000 |
| JP | 2000-82867 A | 3/2000 |
| JP | 2000-216494 A | 8/2000 |
| JP | 2000-327495 A | 11/2000 |
| JP | 2001-342100 A | 12/2000 |
| JP | 2001-077038 A | 3/2001 |
| JP | 2001-148510 A | 5/2001 |
| JP | 2001-185718 A | 7/2001 |
| JP | 2001-210861 A | 8/2001 |
| JP | 2001-247399 A | 9/2001 |
| JP | 2002-009392 A | 1/2002 |
| JP | 2002-26442 A | 1/2002 |
| JP | 2002-029897 A | 1/2002 |
| JP | 2002-053399 A | 2/2002 |
| JP | 2002-68897 A | 3/2002 |
| JP | 2002-134416 A | 5/2002 |
| JP | 2002-241112 A | 8/2002 |
| JP | 2002-274997 A | 9/2002 |
| JP | 2003-527296 A | 9/2003 |
| PL | 350375 A | 5/2003 |
| PL | 347918 | 6/2009 |
| WO | 94/28204 A | 12/1994 |
| WO | 9504845 A1 | 2/1995 |
| WO | 97/13891 A | 4/1997 |
| WO | 98/47170 A1 | 10/1998 |
| WO | 98/55671 A | 12/1998 |
| WO | 01/24284 A | 4/2001 |
| WO | 01/24921 A | 4/2001 |
| WO | 01/68955 | 9/2001 |
| WO | 02/101124 A | 12/2002 |
| WO | WO 02/101120 A | 12/2002 |
| WO | 03/043150 A1 | 5/2003 |
| WO | WO 03/035945 A | 5/2003 |
| WO | 2004/090202 A | 10/2004 |

OTHER PUBLICATIONS

Notification of Reason(s) for Refusal directed to Japanese Patent Application No. 2004-506101, dated Nov. 4, 2009; 4 pages.
D. R. Ketchum et al., Crystal growth of gallium nitride in supercritical ammonia, Journal of Crystal Growth, 2001, p. 431-434, vol. 222, No. 3, Elsevier Science B.V.
R. Dwilinski et al., Exciton photo-luminescence of GaN bulk crystals grown by the AMMONO method, Material Science and Engineering B, 1997, p. 46-49, vol. 50, No. 1-3, Elsevier Science S.A.
R. Dwilinski et al., AMMONO method of GaN and AlN production, Diamond and Related Materials, 1998, p. 1348-1350, vol. 7, Elsevier Science S.A.
R. Dwilinski et al., On GaN Crystallization by Ammonothermal Method, ACTA Physica Polonica A,1996, p. 763-766, vol. 90.
K. Pakula, et al., Growth of GaN Metalorganic Chemical Vapour Deposition Layerts on GaN Sigle Crystals, ACTA Physica Polonica A, 1995, p. 861-864, vol. 88, No. 5.
R. Dwilinski et al., AMMONO method of BN, AlN and GaN synthesis and crystal growth, MRS Internet Journal Nitride Semiconductor Research, 1998, vol. 3, No. 25, MRS Internet Journal Nitride Semiconductor Res.
Yano et al., Control of Nucleation Site and Growth Orientation of Bulk GaN Crystals, Japanese Journal of Applied Physics, Oct. 1999, p. L1121-L1123, vol. 38, No. 10A, Part 2.
Aoki et al., Growth of GaN single crystal from a Na—Ga melt at 750° C and 5MPa of N2, Journal of Crystal Growth, 2000, p. 7-12, vol. 218, No. 1, Elsevier Science B.V.

Yamane et al., Polarity of GaN Single Crystals Prepared with Na Flux, Japanese Journal of Applied Physics, 1998, vol. 37, No. 6A, Part 1, Japanese Journal of Applied Physics.
Kuramata et al., Substrates for III-V nitride semiconductors, Oyobutsuri, 1996, p. 936-940, vol. 65, No. 9.
I. Grzegory, High pressure growth of bulk GaN from solutions in gallium, Journal of Physics Condensed Matter, 2001, p. 6875-6892, v. 13, No. 32, IOP Publishing Ltd.
O. Oda et al., GaN Bulk Substrates for GaN Based LEDs and LDs, Phys. Stat. Sol.(a), 2000, p. 51-58, v. 180, No. 51, IOP Publishing Ltd.
Y. Melnik et al. Properties of Free Standing GaN Bulk Crystals Grown by HVPE, Mat. Res. Soc. Symp. Proc. 1998, p. 269-274, vol. 482, Materials Research Society.
C.M. Balkas et al., Growth of Bulk AlN and GaN Single Crystals by Sublimation, Mat. Res. Soc. Symp. Proc., 1997, p. 41-46, vol. 449, Materials Research Society.
S. Porowski et al., Bulk and homepitaxial GaN-growth and characterisation, Journal of Crystal Growth, 1998, p. 153-158, 189/190, Elsevier Science B.V.
P. Waltereit et al., Nitride semiconductors free of electrostatic fields for efficient white light-emitting diodes, Nature, Aug. 24, 2000, p. 865-868, vol. 406.
O. Btandt et al., Critical issues for the growth of high-quality (Al, Ga)N/GaN and GaN/(In, Ga)N heterostructures on SiC (001) by molecular-beam epitaxy, Applied Physics Letters, Dec. 20, 1999, p. 4019-4021, vol. 75, No. 25, American Institute of Physics.
M. Fukuda, Optical Semiconductor Devices, Wiley Series in Microwave and Optical Engineering,1998, p. 7, John Wiley & Sons Inc., New York.
S. M. Sze, Modern Semiconductor Device Physics, 1998, p. 539-540, 4, John Wiley & Sons Inc., New York.
B. Beaumont et al., Epitaxial Lateral Overgrowth of GaN, phys. stat sol. (b), 2001, p. 1-43, vol. 227, No. 1, Wiley-VCH Verlag, Berlin GmbH, Germany.
M. Yano et al, Growth of nitride crystals, BN, AlN and GaN by using a Na flux, Diamond and Related Materials, 2000, p. 512-515, vol. 9, Elsevier Science S.A.
S. Porowski, High pressure growth of GaN- new prospects for blue lasers, Journal of Crystal Growth,1996, p. 583-589, vol. 166, Elsevier Science B.V.
A. P. Purdy, Ammonothermal Synthesis of Cubic Gallium Nitride, Chem. Mater., Jul. 1, 1999, p. 1648-1651, vol. 11, the American Chemical Society.
Y. C. Lan et al., Syntheses and structure of nanocrystalline gallium nitride obtained from ammonothermal method using lithium metal as mineralizator, Materials Research Bulletin, 2000, p. 2325-2330, vol. 35, Elsevier Science Ltd.
Hydrothermal synthesis of crystals in chloride systems, lzd. Nauka, 1975, p. 124-125 and 133-134, Moscow.
T. Penkala, Zarys Krystalografii (Basic of Crystallography), PWN, 1972, p. 349, Warszawa.
E. K. Sangwal, Elementary Crystal Growth, 1994, p. 331, Lublin.
M. Palczewska et al, Paramagnetic defects in GaN, MRS Internet Journal Nitride Semiconductor Research, 1998, vol. 3, No. 45, MRS Internet J. Nitride Semicond. Res.
X. Mao et al., New Concept Technology Pressure-Variation Liquid Phase Epitaxy, SPIE Photonics Taiwan Conference Proceedings, Jul. 2000, p. 1-12.
S. Hirano et al, Hydrothermal Synthesis of Gallium Orthophosphate Crystals, Bull. Chem. Soc. Jpn., 1989, p. 275-278, 62, The Chemical Society of Japan.
Single Crystal Growth, Hydrothermal Synthesis Handbook,1997, p. 245-255, chapter 1.
R. A. Laudise, What is Materials Chemistry?, Materials for nonlinear optics: Chemical Perspectives, p. 410-433, Chapter 27,American Chemical Society.
N. Sakagami et al., Growth Kinetics and Morphology of ZnO Single Crystal Grown under Hydrothermal Conditions, Journal of the Ceramic Association, 1974, p. 405-413, vol. 82.
T. Sekiguchi et al., Hydrothermal growth of ZnO single crystals and their optical characterization, Journal of Crystal Growth, 2000, p. 72-76, vol. 214/215, Elsevier Science B.V.

K. Yanagisawa et al., Hydrothermal single crystal growth of calcite in ammonium acetate solution, Journal of Crystal Growth, 1996, p. 285-294, vol. 163, Elsevier Science B.V.

K. Yanagisawa et al., Improvement of quality of hydrothermally grown calcite single crystals, Journal of Crystal Growth, 2001, p. 440-444, vol. 229, Elsevier Science B.V.

S. Hirano et al., Growth of gallium orthophosphate single crystals in acidic hydrothermal solutions, Journal of Material Science, 1991, p. 2805-2808, vol. 26, Chapman and Hall Ltd.

S. T. Kim et al., Preparation and propertoes of free-standing HVPE grown GaN substrates, Journal of Crystal Growth, 1998, p. 37-42,194, Elsevier Science B.V.

M. Aoki et al., Growth of GaN single crystals from a Na—Ga melt at 750° C and 5MPs of N2, Journal of Crystal Growth, 2000, p. 7-12, vol. 218, Elseviser Sciences B.V.

N. Kuroda, Precise control of pn-junction profits for GaN-based LD structures using GaN substrates with low dislocation densities,Journal of Crystal Growth, 1998, p. 551-555, vol. 189/190, Elsevier Science B.V.

A. Kaschner, Influence of Doping on the Lattice Dynamics of Gallium Nitride, MRS Internet Journal Nitride Semiconductor Research, 1999, 451, G3, 57.

K. Motoki, Preparation of Large Freestanding GaN Substrates by Hydride Vapor Phase Epitaxy Using GaAs as a Starting Substrate, Jpn. J. Appl. Phys. Feb. 15, 2001, pp. L140-L143, vol. 40 Part 2, No. 2B, The Japan Society of Applied Physics.

T. L. Chu et al., Crystal Growth and Characterization of Gallium Nitride, J. Electrochem. Soc.: Solid-State Science and Technology, Jan. 1994, vol. 121, No. 1, p. 159-162.

I. Akasaki et al, Growth and Propertoes of Single Crystalline GaN Films by Hydride Vapor Phase Epitaxy, Crystal Properties and Preparation, 1991, p. 154-157, vol. 32-24, Trans Tech Publications, Switzerland.

H. Yamane et al., Na Flux Growth of GaN Single Crystals, Journal of the Japanese Association for Crystal Growth, 1998, p. 14-18, vol. 25, No. 4.

H. Yamane et al., Morphology and characterization of GaN single crystals grown in a Na flux, Journal of Crystal Growth, 1998, p. 8-12, vol. 186, Elsevie Science B.V.

L. Liu et al, Substrates for gallium nitride epitaxy, Material Science and Engineering R, Reports: A Review Journal, 2002, p. 61-127, vol. 37, Elsevier Science B.V.

M. K. Kelly et al., Optical patterning of GaN films, Applied Physics Letters, Sep. 16, 1996, p. 1749-1751, vol. 69, No. 12, American Institute of Physics.

W. S. Wong et al., Fabrication of thin-film InGaN light-emitting diode membranes by laser lift-off, Applied Physics Letters, Sep. 6, 1999, p. 1360-1362, vol. 75, No. 10, American Institute of Physics.

S. Porowski et al., Prospects for high-pressure crystal growth of III-V nitrides, Inst. Phys. Conf. the 5th SiC and Related Materials Conf., 1993, 369-372, Series No. 137, chapter 4.

D. Peters, Ammonothermal Systhesis of Aluminum Nitride, Journal of Crystal Growth, 1990, p. 411-418, vol. 104, Elsevier Science Publishers B.V., North-Holland.

T. Inoue et al, Growth of bulk GaN single crystals by the pressure-controlled solution growth method, Journal of Crystal Growth, 2001, p. 35-40, vol. 229, Elsevier Science B.V.

J. W. Kolis et al., Materials Chemistry and Bulk Crystal Growth of Group III Nitrides in Supercritical Ammonia, Mat. Res. Soc. Symp. Proc., 1998, p. 367-372, vol. 495, Materials Research Society.

Q.-S. Chen et al., Modeling of ammonothermal growth of nitrides, Journal of Crystal Growth 258, 2003, p. 181-187, Elsevier Science B.V.

Q.-S. Chen et al., Effects of baffle design on fluid flow and heat transfer in ammonothermal growth of nitrides, Journal of Crystal Growth 266, 2004, p. 271-277, Elsevier Science B.V.

A. Yoshikawa et al., Crystal growth of GaN by ammonothermal method, Journal of Crystal Growth 260, 2004, p. 67-72, Elsevier Science B.V.

T. Hashimoto et al., Growth of gallium nitride via fluid transport in supercritical ammonia, Journal of Crystal Growth 275, 2005, p. e525-e530, Elsevier Science B.V.

B. Raghothamachar et al., Characterization of bulk grown GaN and AlN single crystal materials, Journal of Crystal Growth 287, 2006, p. 349-353, Elsevier Science B.V.

Notification of Reason(s) for Refusal directed to Japanese Patent Application No. 2004-558482, issued on Nov. 17, 2009, 5 pages.

Final office action and PTO-892 Form directed to U.S. Appl. No. 11/969,735, issued on Dec. 4, 2009, 32 pages.

Notification of Reason(s) for Refusal directed to Japanese Patent Application No. 2004-558480, issued on Dec. 15, 2009, 3 pages.

Notification of Reason(s) for Refusal directed to Japanese Patent Application No. 2004-538438, issued on Jan. 5, 2010, 3 pages.

Jin-Kuo Ho et al., Low-resistance ohmic contacts to p-type GaN achieved by the oxidation of Ni/Au films, Journal of Applied Physics, Oct. 15, 1999, pp. 4491-4497, vol. 86, No. 8, American Institute of Physics.

U.S. Office Action, mailed Jan. 25, 2010, directed to U.S. Appl. No. 11/791,716; 22 pages.

U.S. Office Action, mailed Apr. 12, 2010, directed to U.S. Appl. No. 12/109,075; 38 pages.

Kato et al., "MOVPE Growth of GaN on Off-Angle Sapphire Substrate," IEICE Technical Report ED88-22-33, pp. 43-48, May 28, 1988, vol. 88 No. 61, The Institute of Electronics, Information and Communication Engineers of Japan, Kikai-Shinko-Kaikan Bldg., 5-8 Shbakoen 3 chome, Miatok-ku Tokyo 105 Japan.

Sakai et al., "Defect Structure in Selectively Grown GaN Films With Low Threading Dislocation Density," Applied Physics Letter., Oct. 20, 1997, pp. 2259-2261, vol. 71 No. 16, American Institute of Physics.

Canadian Office Action, mailed Apr. 2, 2009, directed to Canadian Patent Application No. 2,449,714; 4pages.

U.S. Office Action, mailed Apr. 28, 2009, directed to U.S. Appl. No. 11/969,735; 26 pages.

Japanese Notification of Reason(s) for Refusal, mailed May 12, 2009, directed to Japanese Patent Application No. 2003-544869; 6 pages.

Japanese Notification of Reason(s) for Refusal, mailed May 7, 2009, directed to Japanese Patent Application No. 2004-506141; 6 pages.

U.S. Office Action, mailed Jun. 1, 2009, directed to U.S. Appl. No. 11/791,716; 8 pages.

Chinese Office Action, mailed Jun. 5, 2009, directed to Chinese Patent Application No. 200580040008.X; 13 pages.

Communication pursuant to Article 94(3)EPC of the corresponding European Patent Application No. 03778841.1.

Communication pursuant to Article 94(3)EPC of the corresponding European Patent Application No. 03733682.3.

Notification of Reason(s) for Refusal, directed to Japanese Patent Application No. 2003-538438, issued on Jul. 28, 2009; 3 pages.

Song, Y. et al., "Bulk GaN Single Crystals: Growth Conditions by Flux Method", Journal of Crystal Growth, Jan. 2003, pp. 275-278, vol. 247 Nos. 3-4, Elsevier Science B.V.

Office Action, mailed on Jul. 30, 2010, directed to U.S. Appl. No. 12/213,212, 15 pages.

\* cited by examiner

BULK MONO-CRYSTALLINE GALLIUM-CONTAINING NITRIDE AND ITS APPLICATION

TECHNICAL FIELD

The subject of this invention is a bulk mono-crystalline gallium-containing nitride for the use as the substrate for epitaxy in the process of obtaining nitride semiconductor structures, as well as a method of preparing the bulk mono-crystalline gallium-containing nitride by using a combination of a flux method and a ammono method.

Group XIII element-containing nitrides (IUPAC, 1989) are a precious material for the opto-electronic industry.

Bulk mono-crystalline gallium-containing nitride is considered a perfect substrate for deposition of epitaxial layers of gallium nitride, whose energy gap may be used for producing laser diodes (LD) and blue light-emitting diodes (LED). The condition however, which must be met so that it could be used as the substrate for epitaxy, is its high crystalline quality and low dislocation density of the single crystal.

Bulk mono-crystalline gallium-containing nitrides obtained through the methods used so far do not meet those requirements. Nevertheless, the expected demand for the material of proper quality stimulates research and technological progress in that field.

BACKGROUND ART

The authors of the publication WO 02/101120 disclosed the method of how to obtain bulk mono-crystalline gallium-containing nitride through crystallization on the seed from the super-critical solution containing a nitride-containing solvent, preferably ammonia. By this method it is possible to obtain bulk mono-crystalline gallium-containing nitrides of a higher quality of parameters compared to the substrates used in industry, which are obtained by deposition methods from the gaseous phase, such as HVPE and MOCVD or MBE, i.e., of lower dislocation density than those substrates. Monocrystals obtained by the method as known from the disclosure of WO 02/101120 show high increments in volume. Due to equilibrium character of the crystallization process, a very high crystalline quality of single crystals is attained from the solution containing a supercritical gallium-containing solvent, compared to the materials used industrially in various centers worldwide. The primary advantage of the technology known from WO 02/101120 is that it can assure a convenient range of pressures and temperatures, in which the re-crystallization process of gallium-containing nitride from the super-critical solution based on the nitride-containing solvent takes place.

In course of further research and developmental work over the method disclosed in WO 02/101120 a number of factors, which had a limiting impact on practical application of that method, were recognized and gradually the encountered barriers were surmounted, both in terms of technology and apparatuses. Some of such barriers are: a limited availability of the feedstock of desired purity, proper quality of crystalline seeds, selection of proper mineralizers and control of the growth rate of single crystals.

Other methods of synthesis of gallium-containing nitrides, such as HNP, are also known. By those methods gallium-containing single crystals of very high crystalline quality and low dislocation density are obtained. Unfortunately, because of the unsatisfactory size and irregular shape of crystals which are obtained thereby, they have not been used so far as the material for the substrate for epitaxy in industrial production of LEDs, LDs and other semiconductor structures. Also, parameters of the process, and in particular the necessity of using very high pressures, significantly limit the feasibility of obtaining crystals of a desired size by this method on an industrial scale.

The studies in that filed show promising results obtained with the use of flux methods of growth of gallium-containing nitrides from a gallium melt in the atmosphere of nitrogen. Those processes are attractive industrially because relatively low temperatures and pressures are used.

The basic starting materials for the process disclosed in WO 02/101120, i.e., the feedstock subject to re-crystallization and the seeds, were obtained by HVPE method, according to which mono-crystalline gallium nitride layers from the gaseous phase are placed on hetero-seeds, in particular on sapphire. As the result of differences between lattice constant of the hetero-seed and the obtained bulk mono-crystalline gallium-containing nitride, as well as the result of differences in thermal expansion of both materials, bulk gallium-containing nitride single crystals, preferably gallium nitride single crystals, obtained by HVPE method have a disordered crystalline structure, which is reflected, e.g., in small radius of curvature of the obtained bulk mono-crystalline gallium-containing nitrides. The use of such single crystals as crystallization seeds in the process of re-crystallization of mono-crystalline gallium-containing nitride from the supercritical ammonia-containing solution leads to propagation of crystalline defects and surface dislocations in mono-crystalline gallium nitride layers obtained on such seeds. Additionally, different conditions of growth on the gallium-terminated and nitrogen-terminated sides of seeds were observed on seeds in the form of wafers oriented perpendicularly to the c axis of the gallium nitride crystalline lattice.

The authors of the publication WO 03/035945 disclosed that it was possible to effectively improve the quality of crystallization seeds by way of covering them with the ELOG structures having surfaces susceptible to lateral growth, i.e., toward the a axis of the crystalline lattice of gallium-containing nitride, i.e., in accordance with the methods of quality improvement of substrates for epitaxy obtained by the methods of growth from the gaseous phase. Considering, however, random arrangement of crystalline defects and surface dislocations, it is impossible, on the seeds covered with ELOG structures, to eliminate in sufficient degree the propagation of crystalline defects of the primary substrate, obtained by HVPE method, to mono crystalline gallium nitride layers deposited from the supercritical solution based on nitride-containing solvent. Surfaces susceptible to lateral growth arranged in small distances from each other are separated by strips grown directly on the primary substrate. It must be noted at this point that multiplied and alternate deposition of the ELOG structures on crystalline seeds cannot be taken into account mainly because of high costs.

DISCLOSURE OF INVENTION

A first object of the present invention is to provide bulk mono-crystalline gallium-containing nitrides grown on the seed, basically without propagation of crystalline defects as present in the seed as well as to assure the substrate for epitaxy from bulk mono-crystalline gallium-containing nitride having improved crystalline properties and reduced dislocation density.

A second object of the present invention is also to provide longer lifetime of semiconductor structures, deposited on a new improved substrate for epitaxy.

A third object of the present invention is also to provide a method of preparing the bulk mono-crystalline gallium-containing nitride by a combination of a flux method and an ammono method.

The inventors unexpectedly discovered that it was possible to achieve those aims by way of preparing the process according to the present invention, which assures bulk mono-crystalline gallium-containing nitrides of required size, geometrical parameters and desired crystalline quality. Consequently, it was possible to obtain a substrate for epitaxy of any orientation and sufficiently high crystallographic quality.

According to the invention, bulk mono-crystalline gallium-containing nitride, grown on the seed at least in the direction essentially perpendicular to the direction of the seed growth, essentially without propagation of crystalline defects as present in the seed, is characterized in that its dislocation density does not exceed. $10^4/cm^2$ and is considerably lower compared to the dislocation density of the seed, and has a large curvature radius of the crystalline lattice, preferably longer than 15 m, more preferably longer than 30 m, and most preferably of about 70 m, which is considerably longer than the curvature radius of the crystalline lattice of the seed.

According to the invention, bulk mono-crystalline gallium-containing nitride grown on the seed, at least in the direction essentially perpendicular to the direction of seed growth, essentially without propagation of crystalline defects as present in the seed, has the FWHM of X-ray rocking curve from (0002) plane, preferably below 40 arcsec (for Cu K α1) and considerably lower than the FWHM of the seed with simultaneous large curvature radius of the crystalline lattice, preferably longer than 15 m, more preferably longer than 30 m, and most preferably of about 70 m, which is considerably longer than the curvature radius of the crystalline lattice of the seed.

The single crystal according to the invention is preferably doped with Za donor-type and/or acceptor-type, and/or magnetic-type dopants, at the concentration from $10^{17}/cm^3$ to $10^{21}/cm^3$, and comprises n-type, p-type or compensated (semi-insulating) material.

Preferably, the single crystal according to the invention is grown in the environment and in the conditions in which the growth rate in the direction perpendicular to the c axis, and in particular parallel to the a axis, is the same or higher than the growth rate in the direction parallel to the c axis of the single crystal.

The single crystal according to the invention is preferably a gallium nitride single crystal.

According to the invention, it is possible to make a wafer of any orientation, with polar or non-polar planes, obtained as a single crystal according to the invention or cut out from such single crystal, whereas the cut is made in a desired direction with respect to the direction of growth of the single crystal.

The wafer according to the invention has preferably its surface dislocation density additionally reduced as the result of slicing in the direction essentially parallel to the direction of the single crystal growth.

The wafer according to the invention has preferably non-polar surfaces, suitable for further processing.

The wafer according to the invention has preferably polar surfaces, suitable for further processing.

According to the invention the wafer may be used as a substrate for epitaxial deposition of semiconductor structures from Group XIII element-containing nitrides.

The invention also comprises the substrate for epitaxial deposition of semiconductor structures from Group XIII element—containing nitrides, which is obtained as single crystal according to the invention or is the wafer according to the invention, and in particular, which is suitable for production of semiconductor structures requiring a nitride substrate of sufficiently low surface dislocation density, especially at Group XIII element-terminated side and has epitaxial surface not smaller than 100 mm², preferably not smaller than 450 mm².

The invention covers also semiconductor structures, which are obtained on the substrate.

Due to preparation of the solution according to the invention it is possible to assure homogenous bulk mono-crystalline gallium-containing nitride, especially gallium nitride, of exceptional crystalline parameters and exceptionally low surface dislocation density, which meet the requirements of the optoelectronic industry.

Mono-crystalline gallium-containing nitride according to the invention has unusual dimensions, regular shape, and at the same time excellent crystalline properties, adjusted to the technological requirements of the optoelectronic industry.

In a particularly preferable example of the invention, bulk mono-crystalline gallium-containing nitride has the assumed parameters of electrical conductivity. This feature of the substrate for epitaxy obtained from gallium-containing nitride single crystals will make it possible to change laser structures and considerably increase the number of such structures per substrate.

At the same time, it should be stressed that the solution according to the invention is also preferable in terms of costs.

Figure 2:
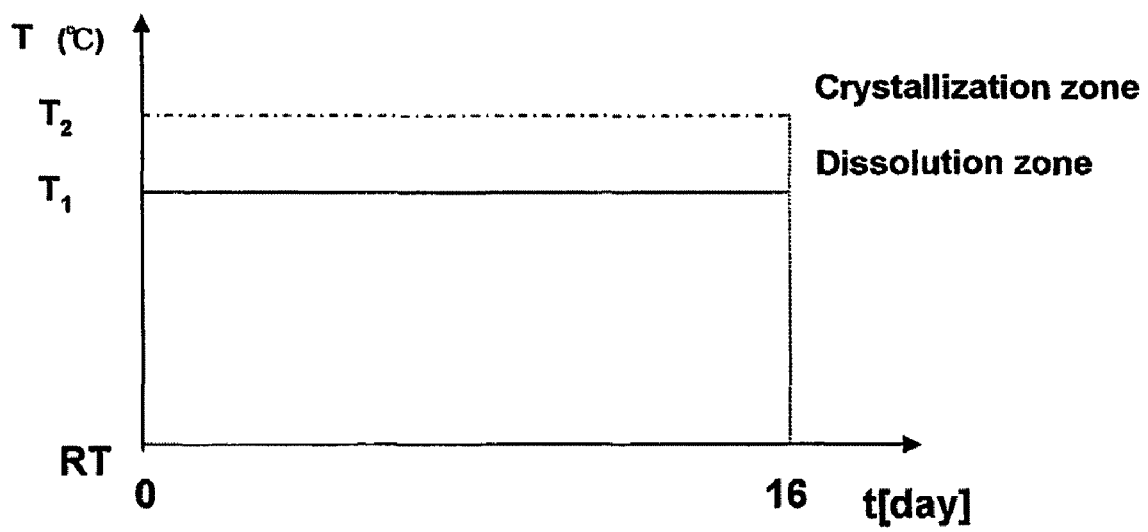
Figure 3:
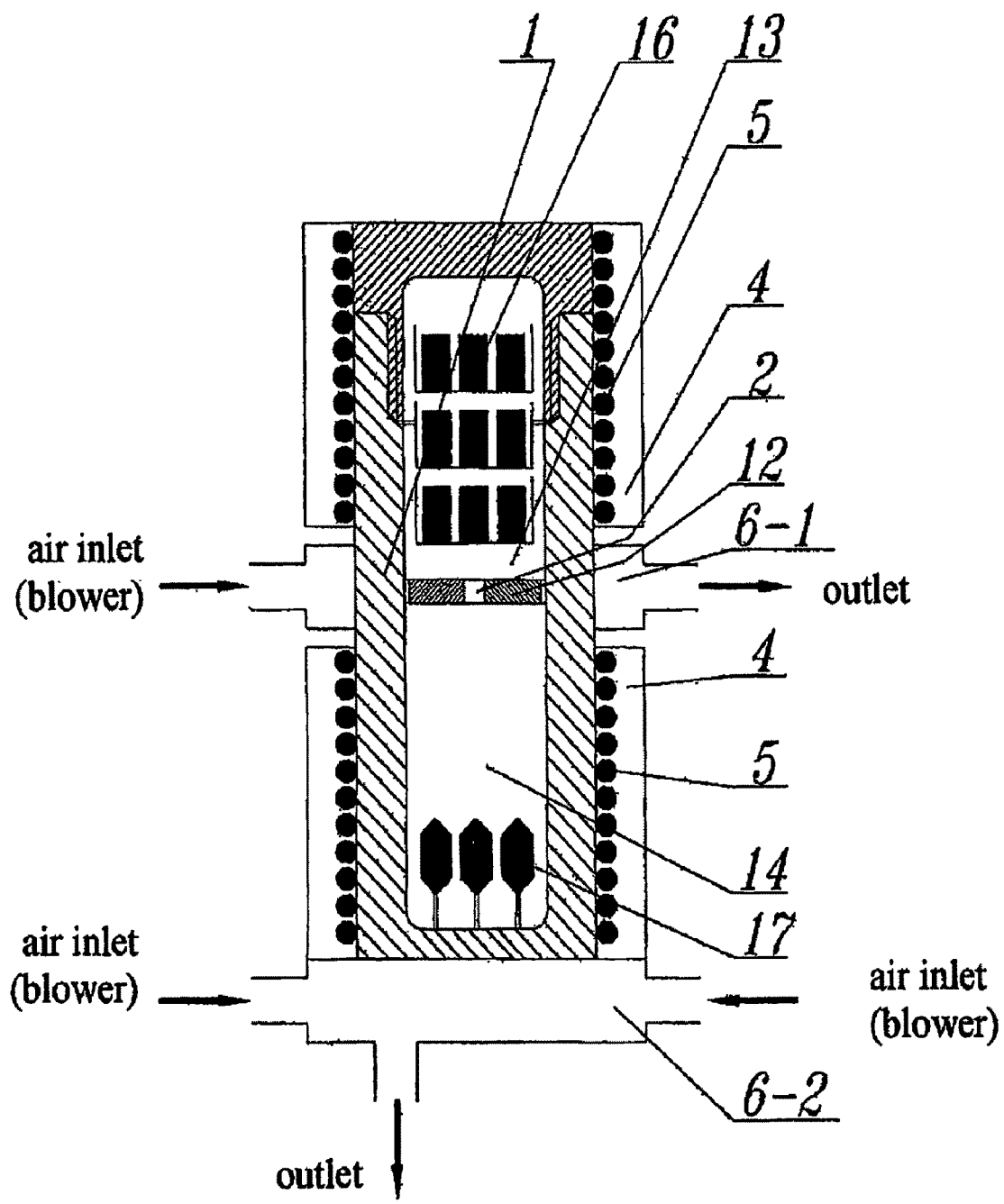
Figure 4:
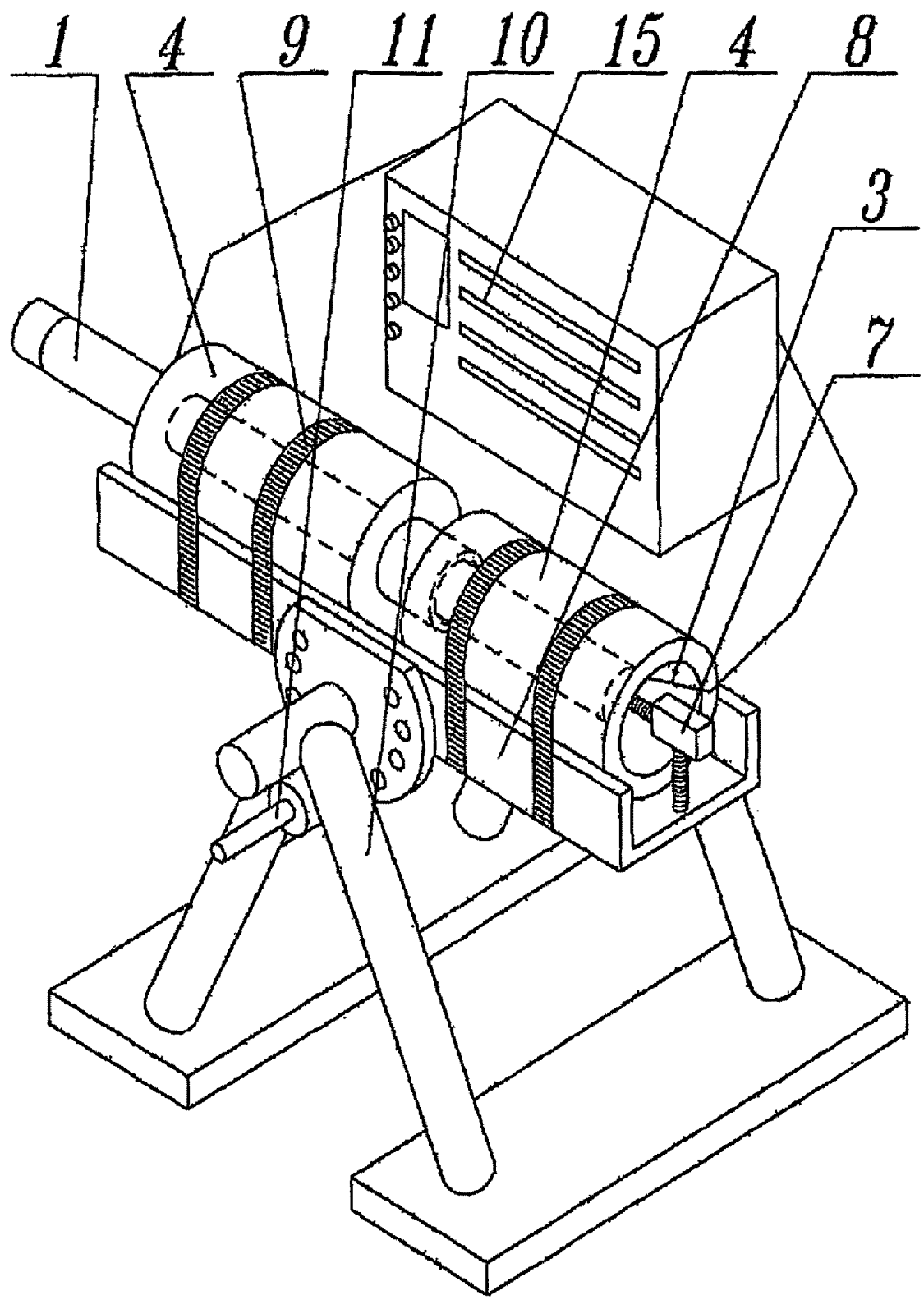

The enclosed drawing FIG. 1 shows a schematic diagram of the crucible for the growth of mono-crystalline gallium-containing nitride by the flux method, FIG. 2 shows the diagram of temperature changes in time in the examples 4-9, FIG. 3 shows the cross-section view of the autoclave and the set of furnaces used in the method of growth from the supercritical ammonia-containing solution, and FIG. 4 shows a perspective view of an apparatus for obtaining mono-crystalline gallium-containing nitride according to the invention.

In the description below the following terms and definitions shall have the following meaning unless otherwise specified.

Autoclave, regardless of its from, includes a closed reaction chamber, in which the crystallization process from fluid phase in the aforementioned range of temperature and pressure is carried out. For crystallization from supercritical ammonia-containing solution it is convenient to use a device presented schematically in FIG. 3 and FIG. 4, discussed in detail further in the text.

Gallium-containing nitride is a chemical compound containing in its structure at least one atom of gallium and one atom of nitrogen. It includes, but is not restricted to, a binary compound—GaN, a ternary compound—AlGaN, InGaN or a quaternary compound AlInGaN, preferably containing a substantial portion of gallium, anyhow at the level higher than dopant content. The composition of other elements with respect to gallium in this compound may be modified in its structure insofar as it does not collide with the selected crystallization technique.

Crystallographic directions c, a or m refer to c, a or m directions of hexagonal lattice, having the following Miller indices: c—[0001], a—[11$\bar{2}$0], m—[1$\bar{1}$00].

Crystallization from melt refers to crystallization by flux method.

Gallium-containing feedstock is gallium-containing nitride or its precursor. As a feedstock, GaN obtained by various methods may be used, among others by flux methods, HNP method, HVPE methods. Moreover, polycrystalline GaN obtained by reaction of metallic gallium with supercritical ammonia-containing solution may be used.

HVPE (Halide Vapor Phase Epitaxy) method refers to a method of deposition of epitaxial layers from gaseous phase, in which (in the case of Group XIII—element nitrides) halides of Group XIII metals and ammonia are used as substrates.

MBE (Molecular Beam Epitaxy) method refers to a method of obtaining epitaxial layers of atomic thickness by depositing molecules from so-called "molecular beam" on a substrate.

MOCVD (Metallo-Organic Chemical Vapor Deposition) method refers to a method of deposition of epitaxial layers from gaseous phase, in which (in the case of nitrides) ammonia and metallo-organic compounds of gallium are used as substrates.

Crystallization methods from fluid phase in this application refer to crystallization from supercritical ammonia-containing solution or to flux method.

Flux methods of obtaining crystalline gallium nitride mean a group of methods, in which said azide is obtained as the result of a chemical reaction between liquid mixture of metals (melt) and nitrogen-containing gas (in particular, it may be gaseous nitrogen or a mixture of nitrogen and ammonia). The melt contains among others gallium and flux. Of course, this process proceeds at appropriate temperature and pressure conditions. In the case sodium, which is a well known flux, typical temperature of the process is ca. 600-800° C., while typical pressure is ca. 5 MPa.

Mineralizer is a substance introducing into the supercritical ammonia-containing solvent one or more Group I element (alkali metal) ions, supporting dissolution of feedstock (and gallium-containing nitride).

Supercritical ammonia-containing solvent is a supercritical solvent consisting at least of ammonia, which contains one or more types of ions of Group I elements (alkali metals), supporting dissolution of gallium-containing nitride. Supercritical ammonia-containing solvent may also contain derivatives of ammonia and/or mixtures thereof, in particular—hydrazine.

Supercritical ammonia-containing solution means a solution obtained as the result of dissolution of gallium-containing feedstock in the supercritical ammonia-containing solvent.

Bulk mono-crystalline gallium-containing nitride means a mono-crystalline substrate in the form of gallium-containing nitride, on which opto-electronic devices may be obtained, such as: light-emitting diodes (LED) or laser diodes (LD) by MOCVD method or by the methods of epitaxy growth such as HVPE.

Crystallographic planes C, A or M refer to C-, A- or M-plane surfaces of hexagonal lattice, having the following Miller indices: C—(0001), A—(11$\bar{2}$0), M—(1$\bar{1}$00). The surfaces are perpendicular to the corresponding crystallographic directions (c, a and m).

Polar or non-polar further-processable surface—means a surface suitable for epitaxial deposition of nitride layers, whereon it is possible to produce at least one optoelectronic device. Such surface should have the size sufficient for epitaxy by MOCVD, MBE methods or other method of epitaxial deposition of nitride layers, preferably larger than 10 mm$^2$, and most preferably larger than 100 mm$^2$.

Polar or non-polar crystalline surface: In crystals of Group XIII element nitrides of wurtzite structure, the crystalline planes parallel to the c axis of the crystal (and crystal surfaces containing those planes) are called non-polar surfaces, whereas, crystalline planes perpendicular to the c axis of the crystal (and crystal surfaces containing those planes) are called non-polar surfaces.

Precursor of gallium-containing nitride is a substance or a mixture containing at least gallium and optionally containing elements of Group I (alkali metals), elements of Group II (alkali earth metals), elements of Group XIII (group numbers according to IUPAC 1989), nitrogen and/or hydrogen, and metallic gallium, its alloys or metallic compounds, hydrides, amides, imides, amido-imides and azides, which may form gallium compounds soluble in the supercritical ammonia-containing solvent as defined below.

Super-Saturation

If concentration of soluble gallium compounds in the supercritical ammonia-containing solution is higher than solubility of gallium-containing nitride in specific physico-chemical conditions, then super-saturation of the supercritical ammonia-containing solution with respect to gallium-containing nitride in those conditions can be defined as the difference between the actual concentration and the solubility. While dissolving gallium-containing nitride in a closed system it is possible to obtain the super-saturation state, for example by increasing temperature or decreasing pressure.

Diffusion process in this application means a process of crystal growth, in which the transport between feedstock and seeds proceeds essentially by diffusion.

Convection process in this application means a process of crystal growth, in which the transport between feedstock and seeds proceeds essentially by convection.

Solubility

Our experiences show that the state of equilibrium may be achieved between the solid (gallium-containing nitride) and the supercritical solution at sufficiently high temperature and pressure. Therefore, solubility of gallium-containing nitride may be defined as the equilibrium concentration of soluble gallium compounds obtained in the above mentioned process of dissolution of gallium-containing nitride. In this process, the equilibrium concentration, i.e. solubility, may be controlled by changing the composition of solvent, temperature and/or pressure.

Dissolution of gallium-containing feedstock means either reversible or irreversible process of forming out of said feedstock gallium compounds soluble in the supercritical solvent, for example gallium-complex compounds. Gallium complex compounds are complex chemical compounds, in which an atom of gallium is a coordination center surrounded by ligands, such as ammonia molecules (NH3) or their derivatives, like NH2-, NH2-, etc.

Selective crystallization on a seed means a process of crystallization taking place on the surface of the seed, in the absence of spontaneous crystallization or with spontaneous crystallization occurring in a negligible degree. This process is indispensable for achieving the aim of the present invention, i.e. obtaining bulk single crystals of gallium-containing nitride, and at the same time it is an essential element of the present invention.

Spontaneous crystallization from the supersaturated supercritical ammonia-containing solution means any undesirable process of nucleation and growth of the gallium-containing nitride crystals taking place at any site within the autoclave except on the surface of the seed. The definition also includes growth on the surface of the seed, in which the grown crystal has an orientation different from that of the seed.

Melt in this application means a mixture of molten metals.

Group XIII element-terminated side, Ga-terminated side, N-terminated side: In the crystals having the wurtzite structure one can distinguish a crystalline direction (crystalline axis) denoted as a and another crystalline direction—c—which is perpendicular to a. In the crystals of Group XIII element nitrides, having the wurtzite structure, the crystalline planes perpendicular to the c axis are not equivalent. In is a habit to call them Group XIII element-terminated side and nitrogen-terminated side or the surface having Group XIII element polarity or nitrogen polarity, respectively. In particular, in the case of mono-crystalline gallium nitride one can distinguish gallium-terminated side (Ga-side) and nitrogen-terminated side (N-side). These sides have different chemical and physical properties (eg. susceptibility to etching or thermal durability). In the methods of epitaxy from the gaseous phase the layers are deposited on the Group XIII element-terminated side.

Temperature and Pressure of the Reaction

In the practical examples presented in the present specification temperature measurements inside the autoclave have been performed when the autoclave was empty, i.e. without the supercritical ammonia-containing solution. Thus, the temperature values cited in the examples are not the actual temperature values of the process carried out in the supercritical state. Pressure was measured directly or calculated on the basis of physical and chemical data for ammonia-containing solvent at selected process temperature and the volume of the autoclave. In the case of flux methods the temperature was measured inside the autoclave, but outside the crucible. Nevertheless, the values of temperature given in this application should be very close to actual temperature values in the melt contained in the crucible.

Flux means a substance added to the reaction environment in flux methods, which helps maintain reactants in liquid phase throughout the process.

Chemical transport of gallium-containing nitride in the supercritical solution means a continuous process involving dissolution of a gallium-containing feedstock in the supercritical solution, circulation of the soluble gallium compounds within the solution and crystallization of gallium-containing nitride from the super-saturated supercritical solution. Generally, chemical transport may be caused by temperature difference, pressure difference, concentration difference, or other chemical or physical differences between the dissolved feedstock and the crystallization product. According to the present invention, bulk mono-crystalline gallium-containing nitride may be obtained in effect of chemical transport between the dissolution and crystallization zones of the autoclave, established by means of temperature difference between the two zones, whereas the temperature of crystallization zone should be higher than the temperature of dissolution zone.

Temperature and pressure coefficient of solubility (TCS and PCS) Negative temperature coefficient of solubility means that the solubility is a decreasing function of temperature if all other parameters are kept constant. Similarly, positive pressure coefficient of solubility means that, if all other parameters are kept constant, the solubility is an increasing function of pressure. Our research allows to state that solubility of gallium-containing nitride in the supercritical ammonia-containing solvent, at least in the temperature range from 300 to 550° C., and pressure from 100 to 550 MPa, shows a negative temperature coefficient (negative TCS) and a positive pressure coefficient (positive PCS).

Lateral growth in this patent application refers to bulk growth on a seed in the direction perpendicular to the original direction of seed growth. In contrast to ELOG (Epitaxial Lateral Overgrowth), the lateral growth is definitely macroscopic (of the order of dimensions of the seed or even larger) and it is the aim of the process. Moreover, the projection of a laterally grown crystal in the direction parallel to the original direction of seed growth goes remarkably beyond the projection of the seed used. In the case of ELOG (Epitaxial Lateral Overgrowth), these two projections are essentially identical.

ELOG (Epitaxial Lateral Overgrowth) is a method of crystal growth from gaseous phase or from supercritical ammonia-containing solution, in which crystals are grown on a special substrate. In the case of gallium nitride crystals, a matrix of parallel ridges (several microns high and several microns wide), having surfaces susceptible to lateral growth, is created on the surface of the substrate. Typically, gallium nitride crystals are grown in the c direction. The ridges are then created along the m direction and the surfaces susceptible to lateral growth coincide with A-planes. In this case, lateral growth is limited to several or several dozen microns and it is finished as soon as the space between the ridges becomes overgrown by the arising crystal. Next, the principal growth of bulk crystal proceeds along the c direction. This way some of the dislocations present in the substrate can be prevented from penetrating into the arising crystal.

Seed is crucial for obtaining a desired bulk gallium-containing nitride monocrystals in a process according to the present invention. In view of the fact that the quality of the seed is crucial for the crystalline quality of the bulk gallium-containing nitride monocrystals obtained by the process according to the present invention, the seed selected for the process should have possibly high quality. Various structures or wafers having a modified surface can also be used. For example a structure having a number of surfaces spaced adequately far from each other, arranged on a primary substrate and susceptible to the lateral overgrowth of crystalline nitrides may be used as a seed. Moreover, a seed having a homoepitaxial surface, exhibiting n-type electric conductivity, for example doped with Si, may be used. Such seeds can be produced using processes for gallium-containing nitride crystal growth from gaseous phase, such as HVPE or MOCVD, or else MBE. Doping with Si during the growth process at the level of 1016 to 1021/cm2 ensures n-type electric conductivity. Moreover, a composite seed may be used and in such seed directly on a primary substrate or on a buffer layer made for example of AlN—a layer made of GaN doped with Si may be deposited

DETAILED DESCRIPTION OF THE INVENTION

Having analyzed their own experience in the scope of applying the method disclosed in WO 02/101120, and verified through tests the reports on available methods of obtaining gallium-containing nitride in the mono-crystalline form, the inventors discovered that the growth of bulk mono-crystalline gallium-containing nitride proceeds at various rates in various environments, and additionally at various rates in the direction of various axes of the hexagonal wurtzite-type crystalline lattice, in which gallium nitride and other gallium-containing nitride are crystallized. This information is directly based on the shape of gallium-containing nitride crystals obtained as the result of the spontaneous crystallization in the processes of obtaining that kind of nitride single crystals.

The fact that spontaneous crystals obtained by the method, as disclosed in WO 02/101120, are in the form of needles of hexagonal section proves that there is a preferable growth toward the c axis of the crystalline lattice of gallium containing nitride.

The low-temperature and low-pressure flux method of obtaining GaN from Ga—Na and Ga—Li melts in the nitrogen atmosphere is also known. Preferable pressure and temperature parameters as required in those processes caused that the authors of this invention became interested in that process as a potential process allowing them to obtain the feedstock and, possibly, crystallization seeds for the crystallization process from the supercritical—preferably ammonia-containing—environment, of gallium-containing nitride solution.

The process of obtaining gallium nitride from the Ga—Na alloy melt is however arduous in technological terms because of the reactivity of sodium with respect to humidity, high pressure of sodium vapors in the process conditions and its sublimation deposition in cooler parts of the reactor. Those properties of sodium as flux cause that it is difficult to apply this method industrially.

The publication Youting Song et. al. in the Journal of Crystal growth 247 (2003) 275-278, reports on crystallization of GaN by flux method with the use of lithium as flux (temperature of about 800° C., pressure 0.2 MPa, the duration of the process 120-180 hours). This report proves that the use of lithium as flux makes it possible to obtain. GaN in less drastic conditions, however an amount of spontaneously formed crystals is still unsatisfactory.

Observations and experiences which have been carried out in terms of application of the flux technology for obtaining the feedstock or seeds, show that flux methods allow for obtaining spontaneous gallium-containing nitride crystals in the form of hexagonal wafers of high crystalline quality and low surface dislocation density. The shape of crystals formed spontaneously (without seeds) shows that there is a preferable growth of gallium-containing nitride—in the process conditions—in directions perpendicular to the c axis of the gallium-containing nitride crystalline lattice.

Like in the flux method, which allows the crystal to grow in directions perpendicular to the c axis, the present research on the method of growth from supercritical ammonia-containing solution show that the crystal growth by this method in the direction perpendicular to the c axis is also possible although it is geometrically limited and may be very slow.

This means that the volume parameters of gallium-containing nitride single crystal obtained by the growth method from the supercritical ammonia-containing solution are, on the one hand, determined by the dimensions, shape and orientation of the seed, and on the other hand, by the duration of the process and feedstock reserves in the system.

As the observations described above show, the growth of gallium-containing nitride single crystal according to all known methods takes place at least partially in the direction close to the direction of the growth of the seed crystal obtained by the same or different method, which unfortunately means that at least partial propagation of crystalline defects as present in seeds takes place in the deposited monocrystalline gallium-containing nitride layers.

It has been recently discovered that it is possible to obtain gallium-containing nitride crystals of essentially higher quality parameters than parameters of the seed crystal through selection of the conditions in which the process of gallium-containing nitride crystallization is carried out. At the same time, while aiming to assure proper dimensions of gallium-containing nitride the authors of this invention put appropriate focus on obtaining a crystal seed of proper dimensions.

The bulk mono-crystalline gallium-containing nitride according to the invention may be obtained by way of controlled growth of a single crystal in a desired direction in the process which comprises the step of growth from the liquid phase in the direction perpendicular to the growth of monocrystalline seed from gallium-containing nitride during the phase of its obtaining.

The single crystal growth from the liquid phase may be carried out by flux method with use of flux assuring liquidity of the system, in the range of temperature from 300° C. to 950° C.

The growth by flux method from the Ga—Li melt, which optionally contains an additional flux X, selected from the group consisting of Bi, In, K, Na, Pb, Rb, Sb, Sn and Te is preferable, whereas the molar ratio of X:Ga:Li is from 0.5:1.0:1.5 to 1.5:1.0:2.5.

Preferably, with the use of flux method, the growth is carried out at temperature from 700° C. to 850° C., at pressure of nitrogen from 2.0 to 2.5 MPa, and optionally with addition of crystalline gallium-containing nitride.

Preferably, in the phase in which the melt is heated to the desired temperature, the protective atmosphere of inert gas, preferably argon, is used. Next, nitrogen is added to the system and the growth of single crystal is carried out on the seed while the temperature gradient is maintained within the melt, whereas the seed is placed in the lower-temperature zone.

It is recommended that, after the crystal growth by flux method is completed, the melt should be initially cooled slowly, and then, cooled fast to the ambient temperature.

Preferably, in the atmosphere of inert gas, it is possible to obtain heterogeneous Ga melt with fluxes by way of heating everything as long as the average temperature of the melt is above 700° C., and followed by stabilization of the melt, the atmosphere is changed, by replacing inert gas with nitrogen under pressure from 2.0 to 2.5 MPa, and next, in the steady conditions the growth of crystals is carried out, and after the growth is completed the obtained crystals may be gradually taken out from the melt in the process conditions or everything may be cooled down as described above, and finally the obtained single crystals are separated by dissolution of the solidified melt.

While heating the Li—Ga melt in zones, the temperature gradient is kept around the melt, and the seeds are placed in a cooler zone.

It should be noted that in course of the diffusion process, the temperature in the heating phase in the inert gas atmosphere is kept lower in the undersurface zone and higher in the bottom zone, whereas after the atmosphere is changed into nitrogen, the temperature gradient is reversed.

Alternatively, in course of the convection process, additional feedstock is used—as internal source of nitrogen in the melt—in the form of crystalline nitride containing lithium, gallium or metal of the group comprising Bi, In, K, Na, Pb, Rb, Sb, Sn or Te, which is an additional flux, and that additional feedstock is brought to the liquid phase by heating everything to the average temperate as specified above, whereas the zone, in which that additional material was placed—to the temperature higher by several dozen degrees centigrade.

Preferably, in both versions of the flux process, the temperature difference between the zones is kept at the level of several dozen degrees centigrade.

According to this invention, the growth of single crystals from the liquid phase may be also carried out by the growth method in the supercritical solution in nitrogen-containing solvent, preferably in the supercritical ammonia-containing solution.

According to this method, the system comprises in the crystallization stage the gallium-containing feedstock, preferably crystalline gallium nitride, Group I elements and/or their mixtures, and/or their compounds, especially those containing nitrogen and/or hydrogen, preferably azides, optionally with addition of Group II elements and/or their compounds, which form the mineralizer, and the mineralizer together with ammonia are used as ammonia-containing solvent. Crystallization of desired gallium-containing nitride is carried out on the surface of the seed, at crystallization temperature higher and/or under crystallization pressure lower than the temperature and pressure of dissolution of the feedstock. There are two temperature zones. There is feedstock in the dissolution zone, and at least one seed is in the crystallization zone, whereas the dissolution zone is located above the crystallization zone and the mass is transported from the dissolution zone to the crystallization zone.

Preferably, the temperature difference between the dissolution zone and the crystallization zone is from 1° C. to 150° C., preferably from 10° C. to 100° C., and in the crystallization zone the temperature is not lower than 350° C., preferably not lower than 400° C., and most preferably ranges from 500° C. to 550° C.

Bulk mono-crystalline gallium-containing nitride according to the invention is preferably obtained by growth in the direction perpendicular to the direction of the seed growth from mono-crystalline gallium-containing nitride of the same chemical composition by the growth method based on supercritical ammonia-containing solution.

Preferably, bulk mono-crystalline gallium-containing nitride according to the invention is obtained by way of controlled growth of single crystal in a desired direction, as the result of at least one phase of growth in the direction perpendicular to the c axis of the single crystal in the liquid phase from the gallium-containing melt, based on lithium, and at least one phase of growth in the direction parallel to the c axis of the single crystal in the supercritical ammonia-containing solution, whereas feedstock and seed are used in each of those phases, and optionally the growth stages in the direction perpendicular to the c axis and in the direction along the c axis are repeated until desired dimensions of the single crystal are obtained along at least one of its axis.

Preferably, the seed used for obtaining bulk mono-crystalline gallium-containing nitride according to the invention is in the form of gallium-containing nitride single crystal in the form of a wafer oriented perpendicularly to the c axis of the single crystal, obtained by the crystallization method from the gaseous phase, with the surface dislocation density not larger than $10^8/cm^2$, and first, this seed is covered with the gallium-containing nitride layer of a desired thickness in the direction parallel to the c axis of single crystal and with the surface dislocation density in the range from $10^4/cm^2$ to $10^6/cm^2$ by the growth method from the supercritical ammonia-containing solution, and then the growth of that wafer is carried out in the direction perpendicular to the c axis by flux method, and next, it is possible to deposit another layer of gallium-containing nitride on the wafer grown perpendicularly towards the c axis of the single crystal while carrying out the growth from the supercritical ammonia-containing solution toward the c axis.

Gallium-containing nitride crystal obtained by HNP method of very low surface dislocation density may be also used as a seed, which is, next, grown in the desired direction: in the direction perpendicular to the c axis by flux method, whereas in the direction along its c axis—by the method of growth from the supercritical ammonia-containing solution, depending on the initial shape of the seed, and after a single crystal of desired dimensions is attained, the wafer of desired orientation is cut out from it, and afterwards it is possible to repeat the growth phase by flux method and/or growth method from the supercritical ammonia-containing solution.

Moreover, the gallium-containing nitride single crystal obtained in the form of hexagonal wafer by flux method as the result of spontaneous crystallization may be used as a seed.

Then, the growth of such seed is carried out along the c axis by the growth method from the supercritical ammonia-containing solution, and after a single crystal of desired dimensions is attained, the wafer of desired orientation is cut out from it, and afterwards it is possible to repeat the growth phase by flux method and/or growth method from the supercritical ammonia-containing solution.

According to another preferable embodiment of this invention, bulk mono-crystalline gallium-containing nitride is obtained through the controlled growth of single crystal in the desired direction, which comprises at least one step of growth in the direction perpendicular to the c axis of the single crystal and at least one step of growth in the direction parallel to the c axis of the single crystal in the supercritical ammonia-containing solution with the use of feedstock and seed.

Usually, for obtaining bulk mono-crystalline gallium-containing nitride according to the invention, gallium-containing nitride wafers obtained by HVPE method are used as seeds.

Preferably, however, a gallium-containing nitride single crystal is used as a seed, in the form of a wafer with at least one non-polar plane, obtained as single crystal or cut out from the single crystal obtained by the crystallization method from the gaseous phase, or more preferably by the growth method from the supercritical ammonia-containing solution, and afterwards the growth of that wafer is carried out in the direction perpendicular to the c axis of the single crystal by the flux method and/or by the growth method from the supercritical ammonia-containing solution.

Bulk mono-crystalline gallium-containing nitride according to the invention may be doped with donor and/or acceptor and/or magnetic-type dopants, at the concentration from $10^{17}/cm^3$ to $10^{21}/cm^3$. As the result of doping the gallium-containing nitride according to the invention is n-type material, p-type material or compensated material (semi-insulating).

Preferably, bulk mono-crystalline gallium-containing nitride is, according to this invention, in the form of gallium nitride.

Preferably, proper dimensions of the seed for obtaining bulk mono-crystalline gallium-containing nitride are assured by subjecting the seed to the initial processing consisting in the growth alternately in the direction parallel to the c axis and in the direction perpendicular to the c axis of the gallium-containing nitride crystalline lattice. The alternate growth of the crystal in the predetermined directions is carried out through the growth alternately by the flux method from the Ga—Li melt in the direction perpendicular to the c axis and by the growth method from the supercritical ammonia-containing solution in the direction parallel to the c axis. Alternatively, one of those methods is used, and in subsequent stages the growth planes in the desired direction are uncovered alternately, and simultaneously the growth in the direction perpendicular to it is reduced.

The examples of how to reduce the growth of gallium-containing nitride single crystals in the desired directions were disclosed in the publication WO 03/035945.

The results of tests on single crystals according to this invention confirm that it is possible to achieve a very high crystalline quality of mono-crystalline gallium-containing nitride based on mono-crystalline gallium-containing nitride wafers obtained by growth methods from the gaseous phase, especially by HVPE method, if in the subsequent steps of the method of obtaining mono-crystalline gallium-containing nitride according to the invention the growth is carried out in the directions perpendicular to the c axis. The wafers obtained in this way have very large curvature radius, longer than 15 m, more preferably longer than 30 m, and most preferably above 70 m, whereas the curvature radius of single crystals grown in the same direction as the direction of seed growth (parallel to the c axis) has a typical value of about 2-15 m. At the same time, the FWHM of single crystals according to the invention is preferably below 40 arcsec.

GaN shows good solubility in supercritical $NH_3$, provided that alkali metals or their compounds such as $NaNH_2$ or $KNH_2$, are introduced to it. Based on the tests carried out by the inventors, solubility is increasing with pressure and decreasing with temperature. Based on those relationships it is possible to carry out the process according to this invention and obtain desired crystals.

Feedstock is placed in the upper zone of the reactor. This zone is maintained under a different temperature regime from that in the lower zone of the reactor, wherein at least one mono-crystalline seed is placed.

In particular, the negative temperature coefficient of GaN solubility in the process environment means that, as the result of the temperature gradient, it is possible to evoke the chemical transport of gallium nitride from the upper reactor zone of lower temperature—which is the dissolution zone of the feedstock in the form of crystalline gallium nitride, to the lower zone of higher temperature—which is the crystallization zone.

The use of crystalline gallium nitride as preferable feedstock in the re-crystallization process of GaN is preferable because it assures the amount of gallium as required for the process in the form which is easily soluble and can be gradually dissolved.

As mentioned above, seeds for crystallization from the supercritical ammonia-containing solution can be obtained by any method. Preferably, GaN crystals are used, which are obtained by HVPE method, by which it is possible to obtain GaN single crystals in the form of wafers of relatively large surface. By using such seeds, bulk mono-crystalline gallium-containing nitride which are obtained according to the invention have very low dislocation density, but simultaneously they are very thick. The material according to the invention is a perfect material for substrates for epitaxial deposition of semiconductor layers. At the same time, it may be used for preparing seeds for subsequent processes which are carried out in the way as described above.

As the mineralizes, it is possible to use alkali metals, their compounds, especially those containing nitrogen and hydrogen and their mixtures. Alkali metals may be selected from Li, Na, K, Rb and Cs, whereas their compounds may be selected from hydrides, amides, imides, amido-imides, nitrides and azides.

The supercritical environment of ammonia-containing solution with addition of ions of alkali metals, used for obtaining bulk mono-crystalline gallium-containing nitride according to the invention may also contain ions of other metals and soluble forms of other elements, introduced intentionally to modify the properties of the obtained mono-crystalline gallium-containing nitride. However, this environment contains also incidental impurities which are introduced together with the feedstock and released to that environment during the process from the elements of applied apparatuses. It is possible to reduce the amount of incidental impurities by the use of high purity reagents, or even additionally purified reagents for the needs of the process. Impurities from apparatuses are also subject to control through selection of construction materials in accordance with the principles as known to the experts in that field.

Preferably, the controlled growth of crystals according to the invention in a desired direction, either perpendicular or parallel to the c axis, is carried out by the method as described in detail in the following examples, which are illustrated by diagrams of relationships between temperature and duration of the process, as presented in the attached drawing. As shown in FIG. 2 the temperature, in the crystallization phase from the supercritical ammonia-containing solution, in the upper zone—which is the dissolution zone of the autoclave as presented briefly in FIGS. 3 and 4 (and described in more detailed below) is kept lower than in the dissolution zone, wherein the temperature is essentially kept at the constant level during the entire crystallization cycle.

In those conditions—as the result of temperature difference between the zones, and the temperature gradient—dissolution of the feedstock takes place in the dissolution zone, and the convection leads to chemical transport between the zones, and when super-saturation of supercritical ammonia-containing solution is attained with respect to GaN the crystallization of GaN is carried out on seeds in the crystallization zone.

During the growth from the supercritical ammonia-containing solution, the value of the temperature difference between the zones may change in a wide range, and preferably, it is from several to several dozens degree centigrade. Additionally, in accordance with the invention the difference of temperatures between the zones may be changed during the process. In this way it is possible to control the growth rate and the quality of the obtained bulk mono-crystalline gallium-containing nitride.

Additionally, it is possible to modify that basic process, for example, by changing the temperature in both zones periodically, yet, the temperature in the crystallization zone must be always higher than the temperature in the dissolution zone.

Authors of the studies over optimization of the flux process which is now used for the controlled growth of gallium-containing crystals, used molybdenum crucibles, as shown in FIG. 1, which are placed in a high-temperature reactor with controlled atmosphere, adjusted to work under increased pressure, and equipped with zonal heating devices. In FIG. 1 the crucible A is filled with the Li—Ga melt containing the above defined additional flux (selected from the group of Bi, In, K, Na, Pb, Rb, Sb, Sn and Te). At the bottom of the crucible A there is crystalline feedstock C in the form of GaN, which is an internal source of nitrogen. The seed B is introduced into the melt at a specified phase of the process, and may be lowered into and pulled out from the melt by way of the mechanism which is not shown on the drawing. Two orientations of the crystalline seed show that the zone of growth on the seed may be oriented in various ways within the crucible.

The growth from the supercritical ammonia-containing solution may be carried out in reactors of various structures. In the following examples, the autoclave 1 which is schematically shown in FIG. 3 and FIG. 4 was used. The autoclave 1, equipped with the installation 2 in the form of the baffle, is equipped with two furnaces 3 and 4 equipped with heating 5 and/or 6 cooling devices. The installation 2 may be in the form of a horizontal baffle or baffles 7 with central and/or circumferential openings, which separate the upper dissolution zone 8 and the lower crystallization zone 9 in the autoclave 1. The temperature value of each zone in the autoclave 1, in the range of temperature of 100 to 800° C., may be set on furnaces 3 and 4 by way of a controlling device (not shown in the drawing). In the autoclave 1 the dissolution zone 8 is above the horizontal baffle or baffles 7 and the feedstock 10 is placed in that zone. Whereas the crystallization zone 9 is below the horizontal baffle or baffles. At least one seed 11 is put in that zone. The place in which that seed 17 is put is below the point of intersecting the ascending and descending convection flows.

Bulk mono-crystalline gallium-containing nitride according to the invention is characterized in that it has very low surface dislocation density. It may contain alkali metals in amount of about 0.1 ppm or more—even more than 1.0 ppm, and even more than 10 ppm alkali metals, which are introduced into the system as a flux or mineralizer (depending on the type of the process of controlled crystal growth in a desired direction). GDMS (Glow-Discharge Mass Spectroscopy) profiles for a product sample according to the invention show the presence of alkali metals in the range from 0.1 ppm to several ppm. Moreover, some transition metals (Fe, Cr, Ni, Co, Ti, Mn), present in the reaction environment, provide a measurable signal. For comparison, the analogical profiles for the GaN crystal obtained by HVPE method show the presence of potassium in the amount below 0.1 ppm. Whereas the profiles of transitional metals are present at the noise level, which proves that there is a very low amount of those elements in the GaN crystal obtained by HVPE method.

On the basis of the performed tests the authors of the invention determined the conditions of controlling the process of growing GaN single crystals on seeds from Ga—Li melts, in the presence of the above specified additional flux and from the supercritical ammonia-containing solution. Those conditions were positively verified also for nitrides containing other elements of Group XIII, and for mixed nitrides containing gallium and other elements of Group XIII. Due to similar parameters of gallium, aluminum and indium nitride crystalline lattices it is possible to partially replace gallium with indium and/or aluminum in gallium-containing nitride obtained according to the invention.

The invention is described in more detail in the following examples.

Example 1

Flux Process

A mixture of metallic gallium and lithium was placed in a high-temperature reactor (FIG. 1) in a molybdenum crucible (A), having the volume of 250 cm$^3$. Additional flux selected from a group consisting of In, K, Na, Pb, Rb, Sb, Sn and Te was also added to the system, in such an amount that the molar ratio of X:Ga:Li in the performed experiments between 0.5:1.0:1.5 and 1.5:1.0:2.5. The mixture was heated to ca. 780° C. in the argon (Ar) atmosphere and—as a result—an alloy of the aforementioned metals of the given molar ratio of X:Ga:Li was obtained. After one day, the atmosphere was changed to nitrogen (N2) under the pressure of 2.3 MPa. Such temperature and pressure conditions in the reactor were then maintained for the next several days. Then the process of growth of mono-crystalline gallium nitride on the seed crystals (B), in the form of mono-crystalline wafers oriented essentially perpendicularly to the c axis of the crystal and having the surface area of the section perpendicular to the c axis from 0.25 to 4 cm$^2$, was started. The duration of the growth process at the process conditions was 1-2 weeks. The reactor was then initially slowly cooled down and then further (fast) cooled down to the room temperature (RT). Alternatively, the seeds were slowly pulled out of the molten alloy at the process conditions. As the result of the process, the increment of the surface area of the seed crystals (measured in the C-plane of the crystal) by ca. 20% was observed. The GaN single crystals obtained in the process were stored for further measurements and use.

Example 2

Diffusion Flux Process

A mixture of metallic gallium and lithium was placed in a high-temperature reactor (FIG. 1) in a molybdenum crucible (A), having the volume of 250 cm$^3$. Additional flux selected from a group consisting of In, K, Na, Pb, Rb, Sb, Sn and Te was also added to the system, in such an amount that the molar ratio of X:Ga:Li in the performed experiments between 0.5:1.0:1.5 and 1.5:1.0:2.5. The mixture was heated in the argon (Ar) atmosphere until average temperature of ca. 780° C. was reached, wherein the temperature in the upper part of the crucible was by several dozen degrees centigrade lower than the average temperature, while the temperature in the lower part of the crucible was by several dozen degrees centigrade higher than the average temperature. As the result—an alloy of the aforementioned metals of the given molar ratio of X:Ga:Li was obtained. After one day the temperature gradient in the crucible was reversed and the atmosphere was changed to nitrogen (N2) under the pressure of 2.3 MPa. Such temperature and pressure conditions in the reactor were then maintained for the next several days. Then the process of growth of mono-crystalline gallium nitride on the seed crystals (B), in the form of mono-crystalline wafers obtained as described in Example 1, oriented essentially perpendicularly to the c axis of the crystal and having the surface area of the section perpendicular to the c axis from 0.25 to 4 cm2, was started. The seeds were placed in the lower part of the crucible. The duration of the growth process at the process conditions was 1-2 weeks. The reactor was then initially slowly cooled down and then further (fast) cooled down to the room temperature (RT). Alternatively, the seeds were slowly pulled out of the molten alloy at the process conditions. As the result of the process, the increment of the surface area of the seed crystals (measured in the C-plane of the crystal) by ca. 10% was observed. The GaN single crystals obtained in the process were stored for further measurements and use.

Example 3

Convection Flux Process

A mixture of metallic gallium and lithium was placed in a high-temperature reactor (FIG. 1) in a molybdenum crucible (A), having the volume of 250 cm$^3$. Additional flux selected from a group consisting of In, K, Na, Pb, Rb, Sb, Sn and Te was also added to the system, in such an amount that the molar ratio of X:Ga:Li in the performed experiments between 0.5:1.0:1.5 and 1.5:1.0:2.5. In addition, GaN-containing feedstock (C) was put at the bottom of the crucible. The mixture was heated in the argon (Ar) atmosphere until average temperature of ca. 780° C. was reached, wherein the temperature in the upper part of the crucible was by several dozen degrees centigrade lower than the average temperature, while the temperature in the lower part of the crucible was by several dozen degrees centigrade higher than the average temperature. As the result—an alloy of the aforementioned metals of the given molar ratio of X:Ga:Li was obtained. After one day the atmosphere was changed to nitrogen (N2) under the pressure of 2.3 MPa. Such temperature and pressure conditions in the reactor were then maintained for the next several days. Then the process of growth of mono-crystalline gallium nitride on the seed crystals (B), in the form of mono-crystalline wafers obtained as described in Example 1, oriented essentially perpendicularly to the c axis of the crystal and having the surface area of the section perpendicular to the c axis from 0.25 to 4 cm2, was started. The seeds were placed in the upper part of the crucible. The duration of the growth process at the process conditions was 1-2 weeks. The reactor was then initially slowly cooled down and then further (fast) cooled down to the room temperature (RT). Alternatively, the seeds were slowly pulled out of the molten alloy at the process conditions. As the result of the process, the increment of the surface area of the seed crystals (measured in the C-plane of the crystal) by ca. 25% was observed. The GaN single crystals obtained in the process were stored for further measurements and use.

Example 4

Crystallization from Supercritical Ammonia-Containing Solution

According to the disclosure of WO 02/101120, dissolution zone of a 600 cm³ high-pressure autoclave (FIG. 3 and FIG. 4) was charged with gallium-containing feedstock, seeds, mineralizer and ammonia. The seeds were gallium nitride single crystals, in the form of mono-crystalline wafers obtained as described in Example 1, oriented essentially perpendicularly to the c axis of the crystal and having the surface area of the section perpendicular to the c axis from 0.25 to 4 cm2. Metallic sodium was used as the mineralizer. The feedstock was placed in the dissolution zone, while the seeds were mounted in the crystallization zone (FIG. 3). The crystallization process on the seeds was carried out under constant temperature conditions of T2=550° C. in the crystallization zone and T1=500° C. in the dissolution zone. This temperature distribution inside the autoclave was maintained for 16 days (FIG. 2). At such conditions the pressure within the autoclave was ca. 390 MPa. As the result of the process, partial dissolution of the feedstock in the dissolution zone and growth of mono-crystalline gallium nitride layers on both sides of each seed in the crystallization zone was observed. The total thickness of the re-crystallized layers (measured along the c axis of the crystal) was ca. 1200 μm (on each seed). The GaN single crystals obtained in the process were stored for further measurements and use.

Example 5

Crystallization from Supercritical Ammonia-Containing Solution

Procedures as described in Example 4 were followed except that instead of metallic sodium—a) metallic lithium, b) sodium azide or c) sodium bromide was used as the mineralizer. After 16 days of the process the growth of mono-crystalline gallium nitride layers on both sides of the seed in the crystallization zone was observed. The total thickness of the re-crystallized layers (measured along the c axis of the crystal) was ca. a) 380 μm, b) 840 μm and c) 530 μm, respectively. The GaN single crystals obtained in the process were stored for further measurements and use.

Example 6

Crystallization from Supercritical Ammonia-Containing Solution

Procedures as described in Example 4 were followed and the seeds used had the form of mono-crystalline wafers oriented essentially perpendicularly to the c axis of the crystal and having the surface area of the section perpendicular to the c axis from 0.25 to 4 cm2, while the these wafers had the shape of squares or isosceles triangles. As the result of the process, partial dissolution of the feedstock in the dissolution zone and growth of mono-crystalline gallium nitride layers on faces parallel to the c axis of the crystal as well as on C faces of the crystal on each seed in the crystallization zone was observed. The total thickness of the re-crystallized layers (measured perpendicularly to the c axis of the crystal) was ca. 2 mm, while the total thickness of the re-crystallized layers (measured along the c axis of the crystal) was ca 1200 μm (on each seed). The GaN single crystals obtained in the process were stored for further measurements and use.

Example 7

Crystallization from Supercritical Ammonia-Containing Solution

Procedures as described in Example 6 were followed except that sodium bromide was used as the mineralizer, instead of metallic sodium. The seeds seed crystals in the form of mono-crystalline wafers oriented essentially perpendicularly to the c axis, having hexagonal shape with six planes parallel to the c axis of the crystal and having the surface area of the section perpendicular to the c axis from 0.25 to 4 cm2 were used. After 16 days of the process the growth of mono-crystalline gallium nitride layers on all faces parallel to the c axis on each seed in the crystallization zone was observed. The total thickness of the re-crystallized layers (measured perpendicularly to the c axis of the crystal) was ca. 1100 μm. The GaN single crystals obtained in the process were stored for further measurements and use.

Example 8

Crystallization from Supercritical Ammonia-Containing Solution

Procedures as described in Example 4 were followed except that during crystallization step the temperature in the crystallization zone was T2=500° C. and in the dissolution zone the temperature was T1=450° C. The seeds used had the form of mono-crystalline wafers oriented essentially perpendicularly to the c axis of the crystal and having the surface area of the section perpendicular to the c axis from 0.25 to 4 cm2, while the wafers had the shape of squares or isosceles triangles and at least one of the side planes was parallel to the A plane of the crystal. As the result of the process, partial dissolution of the feedstock in the dissolution zone was observed and growth of mono-crystalline gallium nitride layers on faces parallel to the c axis of the crystal, of ca. 400 μm in thickness on each seed (measured perpendicularly to the c axis of the crystal), as well as on both C faces of each seed, the total thickness of the re-crystallized layers (measured along the c axis of the crystal) being ca 700 μm on each seed. The GaN single crystals obtained in the process were stored for further measurements and use.

Example 9

Crystallization from Supercritical Ammonia-Containing Solution

Procedures as described in Example 6 were followed except that during re-crystallization stage, after the system reached the target temperatures of T2=550° C. in the crystallization zone and T1=500° C. in the dissolution zone, respectively, the temperature T1 in the dissolution zone was being changed periodically in the range 500-450° C., while the temperature T2 in the crystallization zone was being changed periodically in the range 550-500° C. in such a way that the crystallization zone was always the warmer one. This way the growth of crystals perpendicular and parallel to the c axis was stimulated. After 16 days of the process the growth of mono-crystalline gallium nitride layers on all faces parallel to the c axis as well as on C faces of the crystal on each seed in the crystallization zone was observed. The total thickness of the re-crystallized layers (measured along the a axis, i.e. perpendicularly to the c axis of the crystal) was ca. 900 μm and the total thickness of the re-crystallized layers (measured along the c axis of the crystal) was also ca. 900 μm. The GaN single crystals obtained in the process were stored for further measurements and use.

The crystals which were obtained in examples 1-9 were estimated. Those crystals high crystalline quality, low level of crystalline lattice deflection (long curvature radius of wafers), preferable values of FWHM rocking X-ray curve from (0002) below 60 arcsec, and in more preferable examples (Example 6) below 40 arcsec. The inventors discovered that the suggested techniques of single crystal growth are not limited either in terms of equipment or materials which could essentially lower possibilities of obtaining large-sized single crystals.

Use of proper (preferably alternate) combinations of growth of gallium nitride crystal perpendicularly to the c axis (examples 1-3 and 6-9) and parallel to the c axis (examples 4-6 and 8-9) allows to obtain gallium-containing nitride single crystals of the volume of 2.5 cm$^3$ and the surface face area in C plane of about 5 cm$^2$. Such crystals, due to their high crystalline quality and dimensions, may be sliced into wafers, and then used as the substrate for nitride based opto-electric semiconductor devices. Such wafer may have any orientation, and have either polar or non-polar faces. The cut may be done in a desired direction with respect to the growth of the single crystal. In particular, the cut essentially oriented toward the growth of the single crystal assures additional reduction of surface dislocation density.

The invention claimed is:

1. A method of preparing a bulk mono-crystalline gallium-containing nitride, comprising the steps of:
   initially growing the bulk mono-crystalline gallium-containing nitride on a first surface primarily in a direction perpendicular to a C-axis of a seed using a flux method; and
   subsequently outwardly growing the bulk mono-crystalline gallium-containing nitride on a second surface perpendicular to the first surface and primarily in a direction of the C-axis of the seed using a method causing crystallization from a supercritical ammonia-containing solution.

2. The method of preparing a bulk mono-crystalline gallium-containing nitride according to claim 1, wherein said steps produce the bulk mono-crystalline gallium-containing nitride having a curvature radius of the crystalline lattice greater than 30 m.

3. The method of preparing a bulk mono-crystalline gallium-containing nitride according to claim 1, wherein said steps produce the bulk mono-crystalline gallium-containing nitride having a curvature radius of the crystalline lattice greater than 70 m.

4. The method of preparing a bulk mono-crystalline gallium-containing nitride according to claim 1, wherein said step of growing the bulk mono-crystalline gallium-containing nitride primarily in a direction perpendicular to the C-axis of the seed using the flux method includes growing the bulk mono-crystalline gallium-containing nitride primarily in a direction of an A-axis or an M-axis of the seed.

5. The method of preparing a bulk mono-crystalline gallium-containing nitride according to claim 1, further comprising a step of further growing the bulk mono-crystalline gallium-containing nitride primarily in the direction perpendicular to the C-axis of the seed using the flux method.

6. The method of preparing a bulk mono-crystalline gallium-containing nitride according to claim 5, further comprising a step of further growing the bulk mono-crystalline gallium-containing nitride primarily in the direction of the C-axis of the seed using the method causing crystallization from the supercritical ammonia-containing solution.

7. The method of preparing a bulk mono-crystalline gallium-containing nitride according to claim 1, wherein said step of growing the bulk mono-crystalline gallium-containing nitride primarily in the direction perpendicular to the C-axis of the seed using the flux method includes growing the bulk mono-crystalline gallium-containing nitride from a liquid mixture of metals containing lithium and gallium together with additional flux selected from the group consisting of Bi, In, Pb, Rb, Sb, Sn and Te.

8. A method of preparing a bulk mono-crystalline gallium-containing nitride comprising the steps of:
   providing a gallium-containing nitride seed for crystal growth having a first surface and a second surface perpendicular to the first surface; and
   primarily growing the bulk mono-crystalline gallium-containing nitride on the gallium-containing seed at least on the second surface in a direction substantially perpendicular to a main direction that the seed was previously grown, wherein the main direction is essentially perpendicular to the first surface.

9. The method of preparing a bulk mono-crystalline gallium-containing nitride according to claim 8, wherein said step of primarily growing the bulk mono-crystalline gallium-containing nitride is repeatedly carried out.

10. The method of preparing a bulk mono-crystalline gallium-containing nitride according to claim 8, wherein said step of providing a gallium-containing nitride seed includes obtaining the seed using at least one of a flux method, using an HVPE method or by using crystallization from a supercritical ammonia-containing solution.

11. The method of preparing a bulk mono-crystalline gallium-containing nitride according to claim 8, further comprising growing the bulk mono-crystalline gallium-containing nitride using crystallization from a supercritical ammonia-containing solution.

12. The method of preparing a bulk mono-crystalline gallium-containing nitride according to claim 8, wherein said step of primarily growing the bulk mono-crystalline gallium-containing nitride on the gallium-containing seed at least in a direction substantially perpendicular to a main direction that the seed was previously grown includes using a flux method.

13. The method of preparing a bulk mono-crystalline gallium-containing nitride according to claim 8, wherein said steps produce the bulk mono-crystalline gallium-containing nitride having a curvature radius of the crystalline lattice greater than 15 m.

14. The method of preparing a bulk mono-crystalline gallium-containing nitride according to claim 8, wherein said steps produce the bulk mono-crystalline gallium-containing nitride having a curvature radius of the crystalline lattice greater than 30 m.

15. The method of preparing a bulk mono-crystalline gallium-containing nitride according to claim 8, wherein said steps produce the bulk mono-crystalline gallium-containing nitride having a curvature radius of the crystalline lattice greater than 70 m.

16. The method of preparing a bulk mono-crystalline gallium-containing nitride according to claim 8, wherein said steps produce the bulk mono-crystalline gallium-containing nitride having a dislocation density not exceeding $10^4/cm^2$ and the dislocation density of the bulk mono-crystalline gallium-containing nitride is lower than a dislocation density of the seed, and the bulk mono-crystalline gallium-containing nitride has a curvature radius of the crystalline lattice that is greater than 15 m and the curvature radius of the crystalline lattice is greater than a curvature radius of a crystalline lattice of the seed.

17. The method of preparing a bulk mono-crystalline gallium-containing nitride according to claim 8, wherein said step of primarily growing the bulk mono-crystalline gallium-containing nitride on the gallium-containing seed at least in a direction substantially perpendicular to a main direction that the seed was previously grown includes growing the bulk mono-crystalline gallium-containing nitride in a direction perpendicular to a C-axis of the seed using a flux method; and further comprising the step of primarily growing the bulk mono-crystalline gallium-containing nitride in a direction of the C-axis of the seed using crystallization from a supercritical ammonia-containing solution.

18. A method of preparing a bulk mono-crystalline gallium-containing nitride comprising the steps of:
  providing a gallium-containing nitride seed for crystal growth; and
  primarily growing the bulk mono-crystalline gallium-containing nitride on the gallium-containing seed at least in a direction substantially perpendicular to a main direction that the seed was previously grown;
  wherein said step of primarily growing the bulk mono-crystalline gallium-containing nitride includes growing the bulk mono-crystalline gallium-containing nitride primarily in a direction of an A-axis or an M-axis of the seed using a supercritical ammonia-containing solution.

* * * * *